United States Patent [19]

Driscoll

[11] Patent Number: 4,851,790
[45] Date of Patent: Jul. 25, 1989

[54] CRYSTAL CONTROLLED OSCILLATOR EXHIBITING REDUCED LEVELS OF CRYSTAL-INDUCED LOW FREQUENCY NOISE, VIBRATION SENSITIVITY AND CIRCUIT TEMPERATURE RISE

[75] Inventor: Michael M. Driscoll, Catonsville, Md.

[73] Assignee: Westinghouse Electric Corp., Pittsburgh, Pa.

[21] Appl. No.: 179,684

[22] Filed: Apr. 11, 1988

[51] Int. Cl.⁴ .............................................. H03B 5/36
[52] U.S. Cl. .................................. 331/116 R; 331/162
[58] Field of Search ............. 331/162, 116 R, 116 FE

[56] References Cited

U.S. PATENT DOCUMENTS

| | | | |
|---|---|---|---|
| 3,836,873 | 9/1974 | Healey, III et al. | 331/116 R |
| 3,868,606 | 2/1975 | Driscoll | 333/80 T |
| 4,410,822 | 10/1983 | Filler | 310/311 |
| 4,550,293 | 10/1985 | Driscoll | 331/116 R |
| 4,570,132 | 2/1986 | Driscoll | 331/56 |
| 4,575,690 | 3/1986 | Walls et al. | 331/162 |
| 4,600,900 | 7/1986 | Renoult et al. | 331/116 R |
| 4,616,194 | 10/1986 | Renoult et al. | 331/116 R |

FOREIGN PATENT DOCUMENTS 561966  8/1958  Canada ................................. 331/162

Primary Examiner—Siegfried H. Grimm
Attorney, Agent, or Firm—Joseph C. Spadacene

[57] ABSTRACT

A crystal-controlled oscillator exhibiting reduced levels of crystal-induced low frequency noise, vibration sensitivity and circuit temperature rise includes an amplifier or oscillator sustaining stage which is secured to a heat sink. A plurality of crystals connected with each other in a preselected electrical configuration are secured to a vibration dampening structure which extends from the heat sink, and the plurality of individual crystals are connected with the oscillator sustaining stage via a preselected wavelength section of coaxial cable. The coaxial cable wavelength may be varied to provide that the plurality of individual crystals operate at either series or parallel resonance.

22 Claims, 4 Drawing Sheets

CRYSTAL CONTROLLED OSCILLATOR EXHIBITING REDUCED LEVELS OF CRYSTAL-INDUCED LOW FREQUENCY NOISE, VIBRATION SENSITIVITY AND CIRCUIT TEMPERATURE RISE

BACKGROUND OF THE INVENTION

1. Field of the Invention

This invention relates generally to a crystal controlled oscillator, and more particularly, to an oscillator in which multiple crystals forming a portion of the feedback circuit are connected with the oscillator sustaining stage to provide an improved reduction in phase noise sideband levels and a decrease in the oscillator long term frequency instability. A preselected wavelength section of coaxial cable may be used to connect the multiple crystals and the sustaining stage when physical separation between the crystals and the sustaining stage is necessary.

2. Background Information

Crystal controlled oscillators are well known in the art and generally comprise a single crystal resonator and associated feedback circuitry coupled across a sustaining stage such as an appropriately biased transistor amplifier. For example, U.S. Pat. No. 4,550,293 discloses a narrow band, voltage controlled crystal oscillator having a linear frequency versus tuning voltage response. The oscillator utilizes a single crystal to form a portion of a composite resonator network, and it is stated that the composite network provides improved oscillator output signal frequency stability.

Crystal controlled oscillators which employ a pair of crystal resonators to achieve various results are also well known. U.S. Pat. No. 3,836,873 discloses a two transistor VHF crystal controlled harmonic oscillator having a circuit configuration which provides a large ratio of output power to crystal unit power dissipation without significant degradation of oscillating resonator Q from the crystal unit Q. A cascode amplifier configuration comprising first and second transistors in combination with inductance and capacitance elements provides an oscillator configuration with phase shift in the vicinity of the oscillator frequency dominantly controlled by the quartz crystal unit motional impedance parameters. It is stated that either one or two VHF crystal units with appropriate anti-resonating circuitry may be utilized to achieve a desired minimum of phase noise power spectral density in the oscillator circuit.

U.S. Pat. No. 4,570,132 discloses an oscillator circuit in which two quartz crystal resonators are utilized for frequency control. It is stated that the use of two SC-cut crystal units increases the oscillator circuit signal transmission group delay by a factor of two to three and effects an estimated 6 dB reduction in the oscillator output signal phase noise sideband level at carrier offset frequencies less than the resonator half-bandwidths.

U.S. Pat. No. 4,575,690 discloses a crystal oscillator which includes two crystals connected in either series or parallel relationship with each other. It is stated that the crystals have unequal acceleration sensitivity magnitudes, and are mounted such that their respective acceleration sensitivity vectors are aligned in anti-parallel relationship. At least one electrical reactance, such as a variable capacitor, is coupled to one of the crystals for providing cancellation of acceleration sensitivities. Although the oscillator circuits in this patent illustrate two crystals connected in either series or parallel relationship, U.S. Pat. No. 4,575,690 does not teach the use of two crystals in an oscillator circuit to provide reduced levels of crystal-induced low frequency noise, vibration sensitivity and circuit temperature rise as set forth herein.

While each of these prior art devices includes either a single crystal or a pair of crystals to perform various functions such as establish the oscillator operating frequency and reduce the oscillator output signal phase noise sideband level, there is a need for an improved crystal controlled oscillator capable of providing greater reductions in output signal phase noise sideband levels and long term frequency instability than crystal controlled oscillators heretofore utilized. If desired, the oscillator must also be capable of operating in high vibration environments without experiencing the vibration-induced frequency modulation problems that conventional crystal oscillators would normally experience in this situation. Finally, the oscillator must be designed to prevent the crystals from being subjected to the heat generated by the oscillator active stage power dissipating elements.

SUMMARY OF THE INVENTION

It is therefore the primary object of the present invention to provide a crystal-controlled oscillator wherein a plurality of crystals are coupled to the sustaining stage portion of the oscillator via a preselected wavelength section of coaxial cable to physically separate the crystals from the oscillator sustaining stage. This novel arrangement allows the crystals to be both heat and vibration isolated via a high thermal resistance structure, while the power dissipating sustaining stage is secured to a heat sinking structure. This arrangement results in reduced output signal phase noise sideband levels and vibration-induced frequency modulation.

In accordance with the present invention, there is provided a crystal controlled oscillator having an amplifier section secured to a heat sinking structure, the amplifier section increasing the dB level of a signal passed therethrough by a preselected value of gain. A plurality of crystals are secured to a vibration dampening mechanism to isolate the crystals from the heat sink. The plurality of crystals are connected to each other in a preselected electrical configuration, and are electrically connected with the amplifier section via a circuit coupling means.

Further in accordance with the present invention, there is provided a crystal controlled oscillator which includes an amplifier having an input, an output and a ground reference terminal. The amplifier increases the dB level of a signal passed therethrough from the input to the output y a preselected value of gain to produce an amplified dB signal. A power splitter having an input connected with the amplifier output, a first output and a second, RF output is operable to provide a portion of the amplified dB signal to the splitter first output and the remaining portion of the amplified dB signal to the second, RF output. A first tuning circuit is connected between the power splitter first output and the amplifier input for providing the portion of the amplified dB signal present at the splitter first output to the amplifier input. A plurality of crystals are connected with each other in a preselected electrical configuration, and circuit coupling means connects the plurality of crystals with the amplifier input and the first tuning circuit. The plurality of crystals and the first tuning circuit form an amplifier positive feedback circuit between the power splitter first output and the amplifier input, the feedback circuit establishing a preselected frequency of oscillation for the portion of the amplified DB signal provided to the amplifier input.

Still further in accordance with the present invention, there is provided a crystal controlled oscillator which includes a transistor-type amplifier having a base terminal, a collector terminal and an emitter terminal. The amplifier increases the dB level of a signal passed from the base terminal to the collector terminal by a preselected value of gain to produce an amplified dB signal. A feedback circuit connected between the collector terminal and the base terminal returns a portion of the amplified dB signal to the base terminal. A plurality of crystals that are connected with each other in a preselected electrical configuration are also connected with the amplifier emitter terminal via a circuit coupling means. The plurality of crystals and the feedback circuit are operable to establish a preselected frequency of oscillation for the portion of the amplified dB signal provided to the base terminal from the feedback circuit.

DESCRIPTION OF THE PREFERRED EMBODIMENTS

Figure 1:
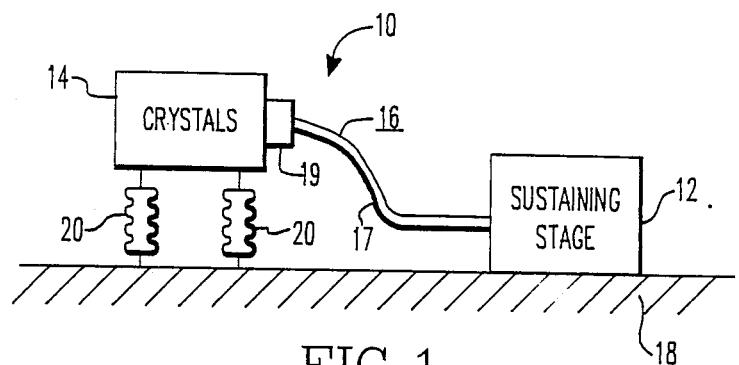
FIG. 1 is a block diagram illustration of the crystal-controlled oscillator of the present invention.

Referring to the drawings and particularly to FIG. 1, there is illustrated a block diagram of the crystal controlled oscillator of the present invention generally designated by the numeral 10. Oscillator 10 includes a sustaining stage 12 which contains the oscillator active devices, such as an amplifier section and a portion of the amplifier positive feedback circuit. A crystal resonator section 14 is electrically connected with sustaining stage 12 via a circuit coupling means generally designated by the numeral 16. As will be explained later in greater detail, circuit coupling means 16 includes a preselected wavelength section of coaxial cable 17 and may also include an impedance network generally designated by the numeral 19 formed from a plurality of discrete inductive and capacitive components to approximate a preselected wavelength section of coaxial cable. The section of cable 17 and impedance network 19 may or may not have the same preselected wavelength, depending upon the packaging or positioning restrictions of the cable within the oscillator housing (not shown).

As seen in FIG. 1, the physical separation between oscillator 10 sustaining stage 12 and crystal resonator section 14 permits the power dissipating, sustaining stage 12 to be secured to a suitable heat sinking structure 18 while crystal resonator section 14 is isolated from heat sinking structure 18 by a pair of high thermal resistance vibration isolators 20. The pair of thermal resistance isolators, which are vibration dampening devices, permit crystal resonator section 14 to be both vibration and thermally isolated from sustaining stage 12 and heat sink 18. This arrangement makes oscillator 10 particularly useful in airborne radar applications or other high vibration environments, since reducing the vibration experienced by the crystal resonator section reduces the amount of vibration-induced oscillator output signal frequency modulation.

Figure 2:
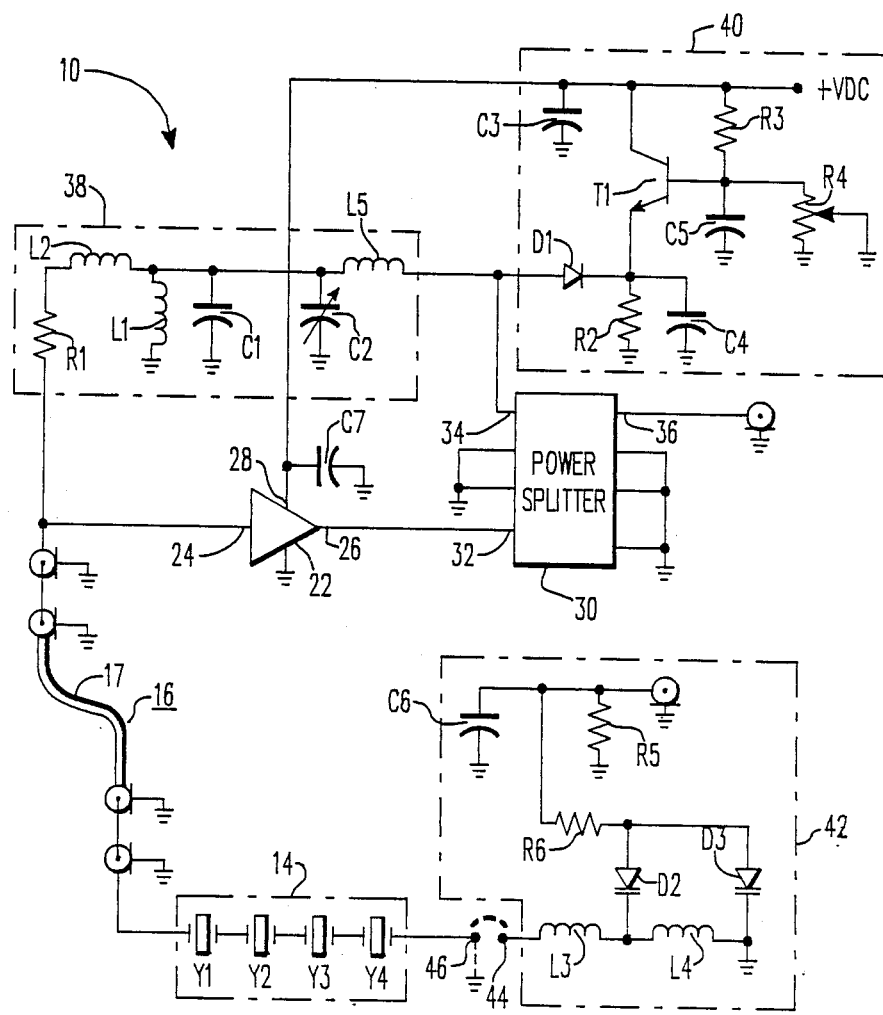
FIG. 2 is a schematic diagram of one embodiment of the crystal controlled oscillator of the present invention, illustrating a plurality of serially connected crystals connected with the oscillator amplifier section via a preselected wavelength section of coaxial cable.

Referring to FIG. 2, there is illustrated a schematic diagram of one embodiment of crystal controlled oscillator 10 which includes a modular-type amplifier 22 having an input 24, an output 26 and a ground reference terminal 28 with a ground capacitor C7 connected thereto. Amplifier 22, which is commercially available through multiple suppliers in the industry and has a preselected value of gain, is designed to provide very high reliability (typical mean time between failures is $8 \times 10^5$ hours) and low 1/f noise. Amplifier 22 exhibits unconditional stability, and is guaranteed to operate in a stable manner free from unwanted oscillations.

A power splitter 30 is provided, and has an input 32 which is connected with the output 26 of amplifier 22. Power splitter 30 includes a first output terminal 34 and a second, RF output terminal 36. It should be understood that power splitter 30 is itself known in the art, and is designed to pass a portion of an RF signal received at input terminal 32 to first output terminal 34, and the remaining portion of the received RF signal to second, RF output terminal 36. As seen in FIG. 2, the portion of the RF signal present at first output terminal 34 is provided to a first tuning circuit generally designated by the numeral 38.

First tuning circuit 38, which is connected between power splitter 30 first output 34 and amplifier 22 input 24, is itself known in the art, and includes inductors L1, L5 and a pair of capacitors C1, C2 connected in parallel relationship with each other. First tuning circuit 38 further includes a resistor R1 serially connected with inductor L2, and these elements are serially connected with the parallel combination L1, L5, C1, C2. First tuning circuit 38 must exhibit a selectivity sufficient to suppress oscillations at unwanted resonant frequency modes of the crystals in crystal resonator section 14, and it has been found that a circuit bandwidth of 10 to 15% suffices. The circuit should also ideally exhibit a signal phase shift at the point of minimum loss equal to and opposite that of the combination of amplifier 22 and power splitter 30. First tuning circuit 38 is operable to adjust the phase shift of a signal passed therethrough from power splitter 30 first output 34 to amplifier 22 input 24.

Oscillator 10 also includes an automatic leveling circuit 40 which is connected between power splitter 30 first output 34 and amplifier 22 ground reference terminal 28. As with first tuning circuit 38, automatic leveling circuit 40 is itself known in the art, and includes a conventional transistor T1. A variable-type resistor R4 and a capacitor C5 are connected between the base of T1 and ground potential. A capacitor C3 is connected between the collector of T1 and ground potential, and a resistor R3 is connected between collector and base. Leveling circuit 40 further includes a resistor R2 and a capacitor C4 connected in parallel relationship with each other and connected to the emitter of T1. A Schottky diode D1 has one end connected to the T1 emitter, and acts to prevent current flow from the T1 emitter to the first tuning circuit 38. Automatic leveling circuit 40 is operable to control the loop gain and set the quiescent signal level at splitter 30 second RF output terminal 36. Essentially, resistors R2, R3, R4, capacitors C3, C4, C5 and transistor T1 furnish an adjustable low noise reverse bias voltage for Schottky diode D1. When the peak RF voltage at D1 exceeds a preset voltage, D1 begins to conduct, thus clipping the RF voltage waveform produced by oscillator 10.

As seen in FIG. 2, the crystal resonator section 14 previously described and illustrated in FIG. 1 is connected with amplifier 22 input terminal 24 via circuit coupling means 16 in the form of a preselected wavelength section of standard, commercially available coaxial cable 17. As will be explained later in greater detail, depending upon the length of coaxial cable required at a desired oscillation frequency, a lumped element network 19 (illustrated in FIG. 6) made from discrete components may be made to approximate a portion of the cable to reduce its overall length.

The crystal resonator section generally designated by the numeral 14 includes a plurality of crystals which are an unobvious replacement for the single crystal resonator section of prior art oscillators. While the following discussion of crystal resonator sections 14 will center around the use of four (4) high Q, bulk crystals Y1, Y2, Y3, Y4, it should be understood that the number of crystals which may be employed can be varied, with at least two (2) such crystals providing an improved oscillator operating characteristic and four (4) such crystals offering significant improvement. As such, this invention is not intended to be limited to the use of four (4) crystals.

As seen in FIG. 2, crystal resonator section 14 includes four serially connected crystals Y1, Y2, Y3, Y4. Since the series resonant frequencies and static-to-motional capacitance ratios of the crystals Y1 through Y4 are easily matched to several parts per million and several percent, respectively, the four crystals essentially exhibit an impedance characteristic similar to a single crystal resonator but at a four times higher impedance level. The use of multiple, serially connected crystals reduces the net effective crystal self-noise (power) spectra by $N^2$, where N is the number of serially connected crystals. This reduction results from the fact that the individual crystal self-noise spectra are uncorrelated. For example, if one considers the effect of noise (frequency instability) in one crystal only, assuming the three remaining crystals are noiseless (stationary frequency) and a single crystal resonant frequency changes by $\Delta f$, the change in the overall (four crystal) series resonant frequency will be $\Delta f/4$. If $S_{YO(f)}$ denotes the fractional frequency (power) spectral density of the oscillator output signal due to net (four crystal) frequency instability, then $$S_{YO(f)} = \frac{S_{Y1(f)}}{16} + \frac{S_{Y2(f)}}{16} + \frac{S_{Y3(f)}}{16} + \frac{S_{Y4(f)}}{16},$$

where $S_{Y1}(f)$, $S_{Y2}(f)$, etc. denotes the fractional frequency $(\Delta f_{RMS}/f_O)^2$ power spectral density of each crystal, and $f_O$ is the crystal fundamental oscillating frequency.

Since oscillator 10 includes a plurality (in this case, four) of crystals, the oscillator can be operated at a four times greater signal level because the maximum signal level is determined by permissible crystal resonator dissipation. For VHF, overtone, AT-cut crystals the $P_{max}$ per crystal is within a range of between 1-2 mW. By setting the total crystal dissipation at +7 dBm via suitable automatic leveling circuit 40 adjustment, and using a 24 dBm compression point amplifier 22, a noise floor level of −173 dBc/Hz may be achieved.

Utilizing four individual crystals Y1 through Y4 as illustrated in FIG. 2 and operating the crystals at series resonance results in a significant improvement in the oscillator 10 flicker of frequency noise attributable to crystal self-noise. This is because the oscillator 10 flicker of frequency noise level is due to short term instability (self-noise) in the crystal resonators themselves and not to noise sources in the sustaining stage circuitry when a readily-available, low 1/f noise sustaining stage amplifier is used. The white phase noise or noise floor portion of the oscillator output signal spectrum is determined by the sustaining stage input signal level and noise figure. Thus, the phase noise sideband level is limited by the maximum allowable crystal resonator drive level (power dissipation), and it is seen that utilizing four individual crystal resonators increases the maximum allowable crystal resonator and sustaining stage drive levels with a corresponding decrease in phase noise sideband floor levels.

It must be appreciated that the use of four (4) crystals affects a reduction in the crystal resonator section 14 long term drift in the same manner as four crystals affect short term frequency instability. For example, assuming four (4) crystals are used, if the aging rates for the crystals are $+3 \times 10^{-11}$/day, $+1 \times 10^{-11}$/day, $-2 \times 10^{-11}$/day and $-4 \times 10^{-11}$/day, the net effect would be an oscillator signal frequency aging rate of $-0.5 \times 10^{-11}$/day. Stated in another manner, since the net aging rate of the four (4) crystals is one-fourth the sum of the aging rates of each of the crystals, the averaging effect of the four crystals increases the resonator long term stability. As previously stated, since this description is not intended to be limited to the use of four (4) crystals, the long term stability of an N-crystal resonator section 14 would be $1/N \times (N_1 + N_2 + N_3 \ldots N_n)$, where $N_1, N_2, N_3, N_n$ are the aging rates of the individual crystals and N is the total number of crystals utilized.

Figure 4:
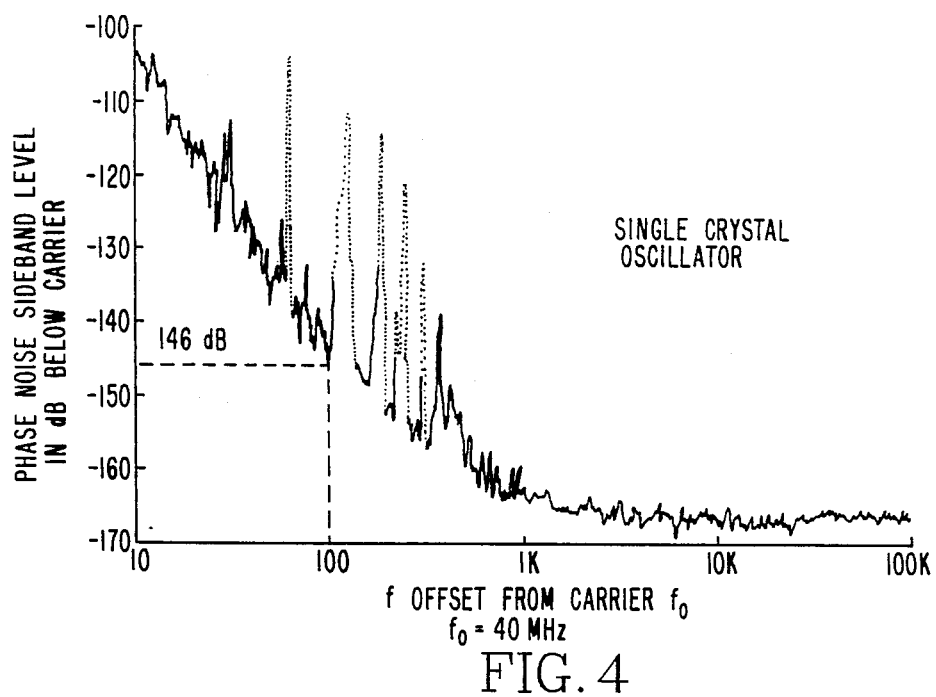
FIG. 4 is a graphical representation of the measured phase noise sideband level at various frequencies separated from the oscillator carrier frequency for a single crystal oscillator.
Figure 5:
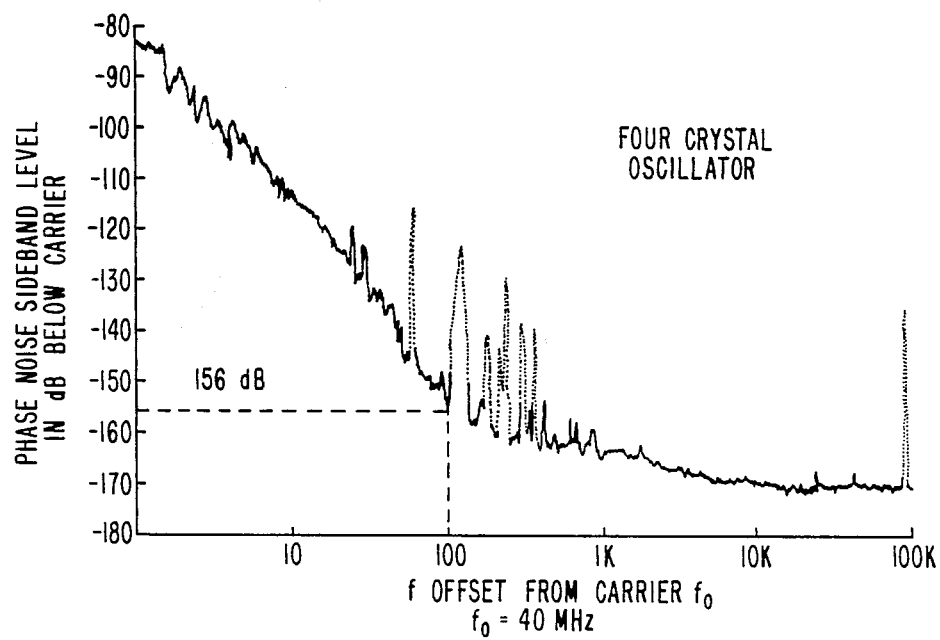
FIG. 5 is a graphical representation of the measured phase noise sideband level at various frequencies separated from the carrier frequency for the multiple crystal oscillator of the present invention.

The improvement in phase noise sideband levels between an oscillator such as oscillator 10 which utilizes four crystals Y1 through Y4, and a conventional single crystal oscillator may be seen by comparing FIG. 4 with FIG. 5. FIG. 4 is a plot of the measured phase noise sideband level versus frequency offset from the carrier frequency for a one crystal, 40 mHz oscillator, and FIG. 5 is the same plot for a four crystal, 40 mHz oscillator. As seen in FIG. 4, at 100 cycles from the carrier frequency $f_o$, the reduction in phase noise sideband level below the carrier frequency is approximately −146 dB/Hz. This compares with an approximately −156 dB/Hz phase noise sideband level 100 cycles from the carrier frequency in the four crystal oscillator illustrated in FIG. 2, and represents a +10 dB improvement.

Again referring to FIG. 2, the oscillator 10 may include, if desired, a second tuning circuit 42 having an output terminal 44 connected to terminal 46 of crystal resonator section 14. Second tuning circuit 42 is known in the art, and is operable to provide precise frequency tuning of crystals Y1 through Y4 to the preselected frequency of oscillation. Second tuning circuit 42 includes a pair of parallel varactor diodes D2, D3. A pair of inductors L3, L4 are serially connected with each other and connected with the diodes D2, D3 as shown. Inductor L3 allows the varactor diode tuning circuit to exhibit both inductive and capacitive reactance to tune to either side of crystal resonance. Inductor L4 is used to linearize the tuning characteristic. A resistor R6 is serially connected with the parallel combination of capacitor C6 and resistor R5, and also connected to the pair of diodes D2, D3 to complete the tuning circuit. Resistors R5, R6 provide a resistive tuning voltage feed to the varactor diodes, and capacitor C6 acts as an RF bypass capacitor.

As previously described, crystal resonator section 14 is connected with the input 24 of amplifier 22 via circuit coupling means 16. In the circuit schematically illustrated in FIG. 2, circuit coupling means 16 is formed from a preselected wavelength section of coaxial cable 17. Coaxial cable 17 is available from multiple suppliers in the industry, and may have a characteristic impedance of either 50, 75, or 91 ohms. The length of coaxial cable 17 may be set at a preselected fraction of the desired wavelength of the RF signal generated by oscillator 10 depending upon whether it is desired to operate crystal resonator section 14 as an equivalent series or parallel resonant circuit at the sustaining stage or amplifier 22 input. For example, if it is desired to operate crystal resonator section 14 as an equivalent parallel resonant circuit, and the overall length of the section of coaxial cable 17 is set at one-quarter wavelength ($\lambda/4$), then the series resonant impedance of the crystal resonator section 14 is transformed to an equivalent parallel resonance due to the impedance inverting properties of the quarter wave line.

In order to assemble the oscillator 10 illustrated in FIG. 2 to operate at 40 mHz, components having the values and/or part numbers listed below in Table 1 should be utilized:

TABLE 1

| Component | Part No./Component Value |
| --- | --- |
| R1 | 39Ω |
| R2 | 330Ω |
| R3 | 4.7KΩ |
| R4 | 5KΩ variable |
| R5, R6 | 10KΩ |
| C1 | 43 pf |
| C2 | 1-10 pf variable |
| C3, C4, C5, C6, C7 | .01 μf |
| L1, L2, L3, L5 | 1 μh |
| L4 | 2.2 μh |
| Transistor T1 | 2N2222 |
| Power Splitter 30 | ANZAC/DS-313 0° Power Splitter |
| Operational Amplifier 22 | Q-Bit Corp. QBH 125 20 dB gain/167° Phase Shift |
| D1 (Schottky Diode) | 1N5711 |
| D2, D3 (Schottky Diode) | JAN 1N5148 |

TABLE 1-continued

| Component | Part No./Component Value |
| --- | --- |
| Coaxial Cable 17 | 46 inch of 50Ω cable |
| Crystals Y1 through Y4 | 5th Overtone AT-CUT/40 mHz |

Figure 3:
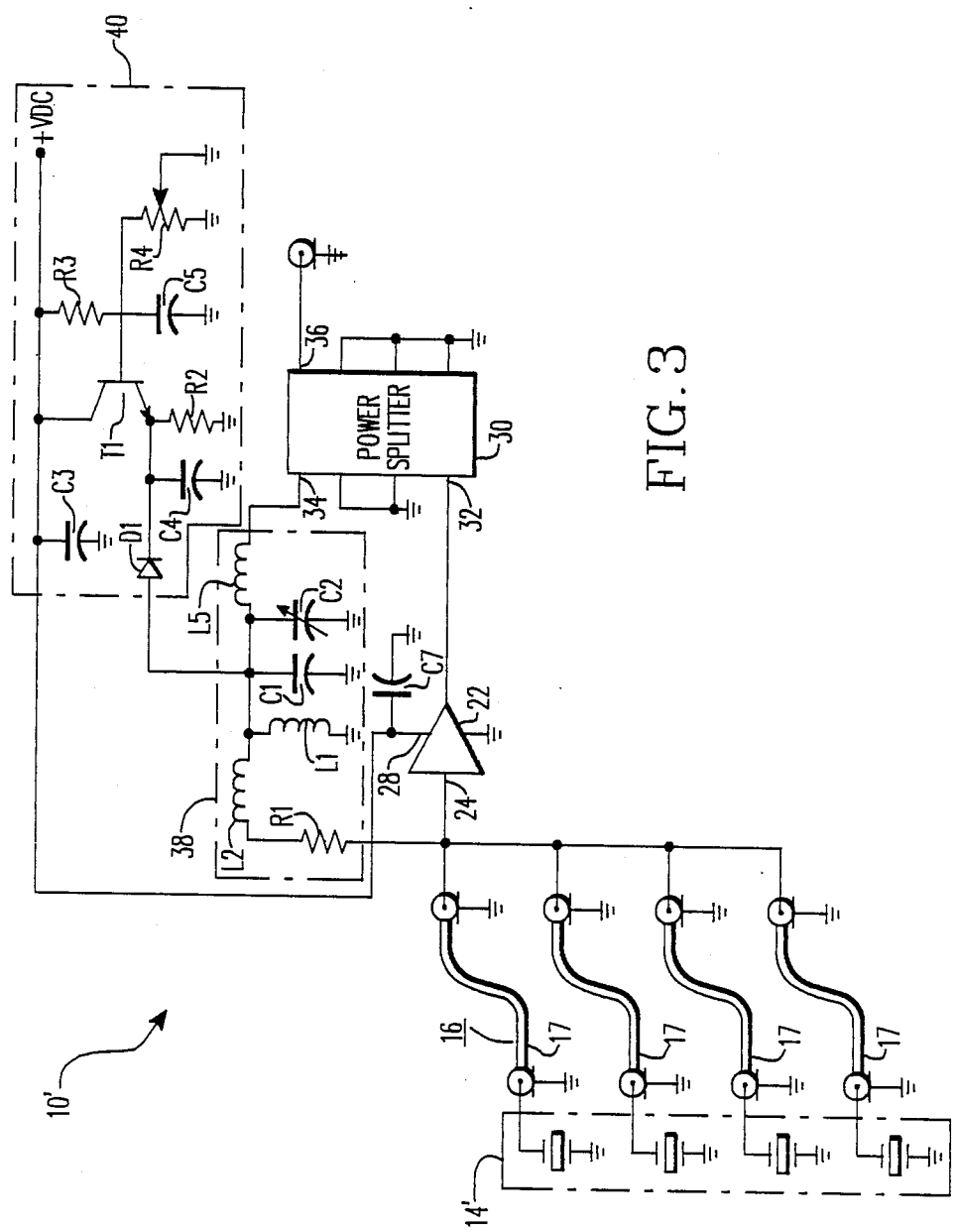
FIG. 3 is a schematic diagram of an alternate embodiment of the crystal controlled oscillator of the present invention, illustrating a plurality of individual crystals connected in parallel relationship with each other via individual sections of coaxial cable.

Now referring to FIG. 3, there is illustrated an alternate embodiment of crystal controlled oscillator 10 generally designated by the numeral 10'. As with the oscillator 10 of FIG. 2, it should be understood that although the following discussion centers around the use of four (4) crystals Y1, Y2, Y3, Y4, the number of crystals that may be employed can be varied with at least two (2) such crystals providing approved oscillator performance.

As seen in FIG. 3, the alternate oscillator 10' includes the amplifier 22, power splitter 30, first tuning circuit 38 and automatic leveling circuit 40 previously described for the oscillator 10 of FIG. 2. The alternate oscillator 10' also includes a crystal resonator section 14' connected with the input 24 of amplifier 22. However, as seen in FIG. 3, the crystal resonator section 14' is formed from four individual crystals Y1, Y2, Y3 and Y4 which are connected in parallel electrical relationship with the input 24 of amplifier 22 via four individual circuit coupling means 16 in the form of preselected wavelength sections of commercially available coaxial cable 17. The advantage associated with the use of this configuration is that the individual coaxial cables 17 can be appropriately cut to a length slightly less than the length corresponding to the preselected wavelength in order to absorb the static capacitance of each of the crystals, thereby relaxing the requirement for very accurate crystal frequency set-on tolerance. The utilization of four individual crystals each connected to the amplifier 22 input 24 via an individual coaxial cable 17 permits larger variations in the individual crystal resonant frequencies without the resultant effect of Q degradation and spurious resonances for the multi-crystal network.

As previously described for the single coaxial cable 17 arrangement illustrated in FIG. 2, each of the coaxial cables 17 illustrated in FIG. 3 has a length which is set at a preselected fraction of the desired wavelength of the RF signal generated by oscillator 10 so that a parallel resonant impedance is provided at the sustaining stage input. If the overall length of the coaxial cable 17 is set at one-quarter wavelength ($\lambda/4$), then the series resonant impedance of the crystal resonator section 14 is transformed to an equivalent parallel resonant impedance due to the inverting properties of the quarter wave line.

As described, both the oscillator 10 of FIG. 2 and the alternate oscillator 10' of FIG. 3 employ a plurality (at least four) of individual crystals Y1 through Y4 to form a crystal resonator section which is connected to the amplifier input via a coaxial cabling. This coaxial cable-type connection is extremely useful in airborne systems or other systems which are subjected to extremely high vibration levels. The use of coaxial cable allows the crystal resonator section to be physically isolated from the amplifier section or power dissipating sustaining stage, and the sustaining stage may be heat sunk while the crystal resonator section is secured to a suitable vibration dampening device. Since that crystals exhibit changes in frequency when subjected to vibration, physically isolating the crystals from the remainder of the oscillator circuitry and vibration isolating the crystals provides a superior operating performance heretofore unattainable with conventional oscillator circuitry arrangements.

If desired, the amplifier 22, power splitter 30, first and second tuning circuits 38 and 42, and automatic leveling circuit 40 may each be made from 50 ohm modular components to minimize the overall component count in each subcircuit and provide circuit reliability. In addition, by designing each of these subcircuits to operate between 50 ohm source and load impedances, the performance of the subcircuits and combinations thereof can be accurately characterized and verified using 50 ohm test equipment. This facilitates the accurate prediction of overall circuit performance and the screening of components to enhance oscillator reliability.

Figure 6A:
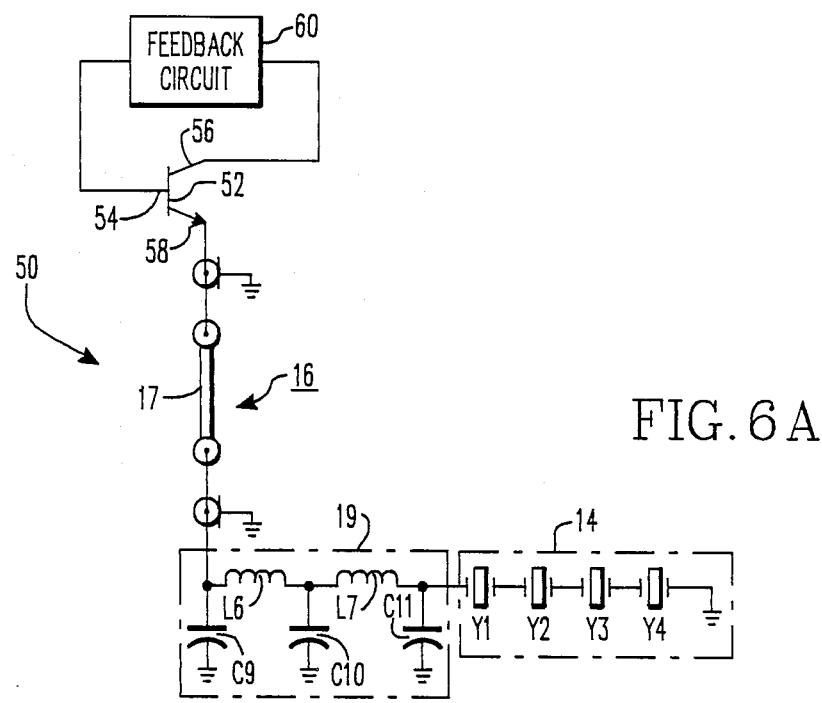
FIGS. 6A and 6B are schematic diagrams of additional alternate embodiments of the oscillator of the present invention, illustrating a plurality of serially connected crystals connected with the transistor section of the oscillator via a section of coaxial cable and a network formed from discrete components that approximate the characteristics of a section of coaxial cable.
Figure 6B:
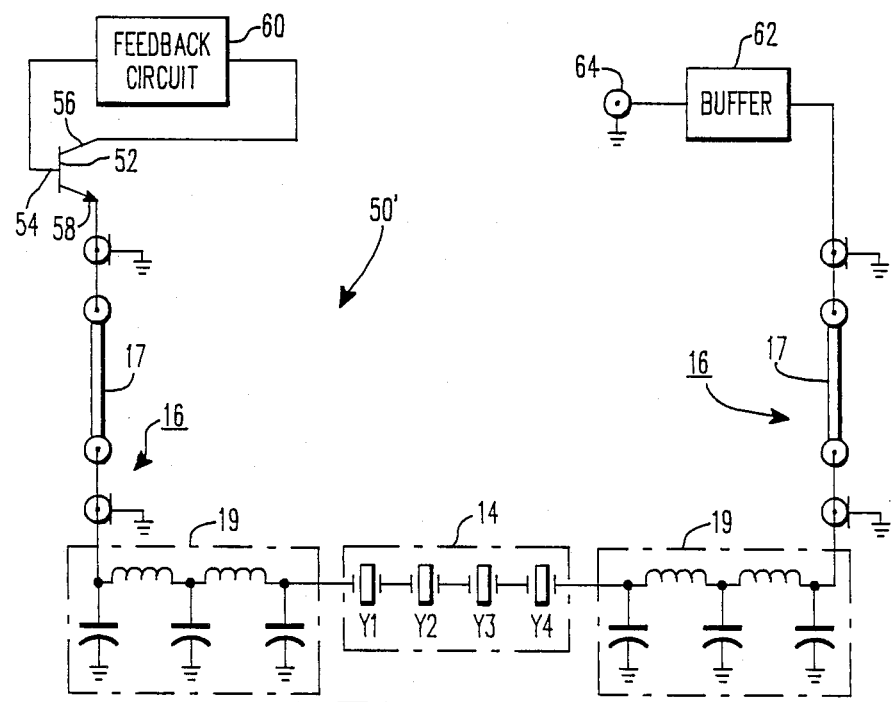

Now referring to FIGS. 6A and 6B, there are illustrated a pair of oscillators 50 and 50' which also utilize the crystal resonator section 14 and circuit coupling means 16 previously described. Oscillators 50 and 50' are alternate embodiments of the oscillator 10 of FIG. 2. As with the oscillators 10 and 10' of FIGS. 2 and 3, the oscillators 50 and 50' are not intended to be limited to the use of four (4) crystals Y1 through Y4 in their respective resonator sections 14.

In oscillators 50 and 50', the effective length of circuit coupling means 16 is one-half wavelength ($\lambda/2$) The oscillators 50 and 50' are discrete component-type oscillators and each includes a transistor 52 having a base 54, collector 56 and emitter 58. A feedback circuit generally designated by the numeral 60 is connected between transistor 52, base 54 and collector 56. It should be pointed out that the DC biasing circuitry required for oscillators 50, 50' has not been shown, and that oscillators which include a transistor 52, a feedback circuit 60 and transistor 52 biasing circuitry are well-known in the art.

As seen in FIG. 6A, the oscillator 50 includes the plurality of crystals Y1 through Y4 previously described to form crystal resonator section 14, and the crystal resonator section 14 is connected with transistor 52, emitter 58 via circuit coupling means 16 having an effective length of $\lambda/2$. Since the effective length of circuit coupling means 16 is $\lambda/2$, the individual crystals of crystal resonator section 14 provide a series resonant impedance at emitter 58. As previously described, if the length of circuit coupling means 16 is set at a wavelength of $\lambda/4$, then the series resonant impedance of the crystal resonator section 14 is transformed to an equivalent parallel resonance due to the impedance inverting properties of the quarter wave line. If the length of circuit coupling means 16 is set at one-half wavelength ($\lambda/2$), however, then the series resonant characteristic of crystal resonator section 14 exhibits, due to the inherent characteristic of the cable, a series resonant characteristic at transistor 52, emitter 58. Thus, the overall length of circuit coupling means 16 may be selected to provide that the plurality of individual crystals Y1 through Y4 operates as either a series or parallel resonant circuit.

Circuit coupling means 16 includes a preselected wavelength section of coaxial cable 17, and also includes an impedance network generally designated by the numeral 19 disposed between crystal resonator section 14 and coaxial cable 17. Impedance network 19 is formed from a plurality of discrete inductive elements L6, L7, and a plurality of capacitive elements C9, C10, C11. Network 19 represents a lumped element approximation of a preselected wavelength section of coaxial cable. Impedance network 19 is utilized in situations where, at a desired operating frequency of oscillation, the overall physical length of the preselected wavelength section of cable required is excessive for efficient packaging or positioning within the oscillator housing (not shown). In order to reduce the required length of coaxial cable, impedance network 19 is utilized. Since it is desired to operate the plurality of individual crystals Y1 through Y4 illustrated in FIG. 6A as a series resonant impedance at emitter 58, the section of coaxial cable required should have a length of one-half wavelength ($\lambda/2$). However, if it is determined that a $\lambda/2$ section of coaxial cable will be excessive for efficient packaging or positioning, then a one-quarter wavelength ($\lambda/4$) section of coaxial cable 17 will be serially connected with an impedance network 19 which is designed to approximate the characteristics of a $\lambda/4$ coaxial cable. Since the one-quarter wavelength cable and the one-quarter wavelength impedance network are additive to approximate an overall one-half wavelength, the plurality of individual serially-connected crystals Y1 through Y4 are connected in series resonant relationship with the emitter 58 of transistor 52.

If desired, a pair of impedance networks 19 may be utilized in conjunction with a pair of cables 17 as illustrated in FIG. 6B to connect the plurality of serially-connected crystals Y1 through Y4 which form crystal resonator section 14 between transistor 52 emitter 58 and an oscillator buffer circuit generally designated by the numeral 62. Buffer circuit 62 is itself known in the art, and is operable to provide proper impedance matching between the plurality of crystals and an external load (not shown) connected with buffer circuit 62 output terminal 64. Each of the coaxial cable sections 17 is a one-quarter wavelength cable, and each of the networks 19 provides a lumped element approximation of a one-quarter wavelength section of coaxial cable. Utilizing the circuit arrangement illustrated in FIG. 6B permits the plurality of crystals Y1 through Y4 to be physically isolated from the heat dissipating components of buffer circuit 62, feedback circuit 60 and transistor 52. These heat dissipating components may be positioned on a heat sinking structure such as heat sink 18 illustrated in FIG. 1, and the sections of coaxial cable 17 provide physical separation between crystal resonator section 14 and the power dissipating components to prevent heat transfer from these components to the crystals. With this physical separation, the individual crystals Y1 through Y4 may be vibration isolated via their connection to a high thermal resistance isolator structure.

It should be understood that in situations where it either is not necessary or desirable to physically separate the crystal resonator section from the oscillator sustaining stage, the section or sections of coaxial cable connecting the crystals with the sustaining stage may be entirely replaced with an impedance network which represents a lumped element approximation of the coaxial cable. In this case, the impedance value of the network will determine the manner in which the crystals resonate or oscillate at the sustaining stage input. For example, in the oscillator circuits illustrated in FIGS. 2, 3 and 6A, coaxial cable 17 may be entirely replaced by an impedance network 19 (shown in FIG. 6A) which is a lumped element approximation of coaxial cable 17. The impedance value of network 17 is selected to provide that the crystals operate at parallel resonance when the network approximates a one-quarter wavelength section of coaxial cable at the frequency of oscillation, and operate at series resonance when the network approximates a one-half wavelength section of coaxial cable at the frequency of oscillation. In like manner, the pair of coaxial cables 17 illustrated in FIG. 6B may be eliminated and replaced with a pair of impedance networks 19.

It should be further understood that while the invention has been described herein as using four (4) high Q, bulk crystals, the actual number of such crystals which may be employed is variable with at least two (2) such crystals providing an operating improvement over one crystal oscillators, and four (4) such crystals offering significant improvement.

As described herein, forming the crystal resonator section of an oscillator from a plurality of individual crystals and coupling the crystals to the oscillator sustaining stage via a preselected wavelength section of coaxial cable provides many benefits over conventional crystal controlled oscillators. The utilization of a plurality of crystals permits the use of a higher overall circuit drive level since the total crystal dissipation is shared by each crystal which results in higher signal-to-noise floor levels. The coaxial cable permits physical separation between the oscillator sustaining stage and the crystals. This physical separation allows the crystals to be vibration isolated to prevent vibration-induced frequency modulation and permits the power dissipating active stage elements to be secured to a heat sink. Lastly, the use of multiple crystals results in reduced levels of flicker of frequency noise sideband levels due to crystal self noise.

Finally, it should be pointed out that although the sections of coaxial cable 17 described herein have been identified as one-quarter wavelength cables, these cables may have any desired wavelength. For example, in the oscillator 50 illustrated in FIG. 6A, it may be desired to utilize a section of actual coaxial cable 17 having a length less than one-quarter wavelength. However, the effective one-quarter wavelength cable may be realized with a coaxial cable having, for example, a 0.05 wavelength cable. If this is done, then impedance network 19 will be designed to provide a 0.45 wavelength coaxial cable approximation so that a total effective one-half wavelength is achieved.

Although the present invention has been described in terms of what are at present believed to be its preferred embodiments, it will be apparent to those skilled in the art that various changes may be made without departing from the scope of the invention. It is therefore intended that the appended claims cover such changes.

I claim:

1. A crystal controlled oscillator comprising:
    an amplifier having an input, an output and a ground reference terminal;
    said amplifier increasing the dB level of a signal passed therethrough from said input to said output by a preselected value of gain to produce an amplified dB signal;
    a power splitter having an input connected with said amplifier output, a first output and a second, rf output;
    said power splitter being operable to provide a portion of said amplified dB signal to said splitter first output and the remaining portion of said amplified dB signal to said second, rf output;
    a first tuning circuit connected between said power splitter first output and said amplifier input for providing said portion of said amplified dB signal to said amplifier input;
    a plurality of crystals connected to each other in a preselected electrical configuration;
    said plurality of crystals being operated at substantially identical resonant frequencies and having substantially identical static-to-motional capacitance ratios to provide that said plurality of crystals exhibit an impedance characteristic substantially identical to the impedance characteristic of one of said plurality of crystals at an impedance level having a value substantially equal to the impedance level of one of said crystals multiplied by the actual number of crystals forming said plurality of crystals;
    circuit coupling means for connecting said plurality of crystals with said amplifier input and with said first tuning circuit; and
    said plurality of crystals and said first tuning circuit forming an amplifier feedback circuit between said power splitter first output and said amplifier input, said feedback circuit establishing a preselected frequency of oscillation of said portion of said amplified dB signal provided to said amplifier input.

2. A crystal controlled oscillator as set forth in claim 1 in which:
    at least a portion of said circuit coupling means is formed from a section of coaxial cable having a first preselected wavelength at said frequency of oscillation;
    the remaining portion of said circuit coupling means is formed from an impedance network serially connected with said section of coaxial cable, said network representing a lumped element approximation of a section of coaxial cable having a second preselected wavelength at said frequency of oscillation; and
    the sum of said first and second preselected wavelengths determining the manner in which said plurality of crystals resonate at said amplifier input.

3. A crystal controlled oscillator as set forth in claim 2 in which:
    said plurality of crystals operate as a parallel resonant circuit at said amplifier input when said sum of said first and said second preselected wavelengths substantially equals one-quarter wavelength at said frequency of oscillation.

4. A crystal controlled oscillator as set forth in claim 2 in which:
    said plurality of crystals operate as a series resonant circuit at said amplifier input when said sum of said first and second preselected wavelengths substantially equals one-half wavelength at said frequency of oscillation.

5. A crystal controlled oscillator as set forth in claim 1 in which said plurality of crystals includes:
    at least four AT-cut crystals serially connected with each other.

6. A crystal controlled oscillator as set forth in claim 1 in which:
    said plurality of crystals are serially connected with each other; and
    said circuit coupling means is formed from a preselected wavelength section of coaxial cable at said frequency of oscillation, said wavelength determining the manner in which said plurality of serially connected crystals resonate at said amplifier input.

7. A crystal controlled oscillator as set forth in claim 6 in which:
said crystals operate as a parallel resonant circuit at said amplifier input when said section of coaxial cable substantially equals one-quarter wavelength at said frequency of oscillation.

8. A crystal controlled oscillator as set forth in claim 6 in which:
said crystals operate as a series resonant manner circuit at said amplifier input when said section of coaxial cable substantially equals one-half wavelength at said frequency of oscillation.

9. A crystal controlled oscillator as set forth in claim 1 in which:
said plurality of crystals are connected in parallel relationship with each other by said circuit coupling means; and
said circuit coupling means includes an individual section of coaxial cable connected between each of said plurality of crystals and said amplifier input.

10. A crystal controlled oscillator as set forth in claim 9 in which:
said plurality of crystals includes at least four AT-cut crystals connected in parallel relationship with each other.

11. A crystal controlled oscillator as set forth in claim 1 in which:
said circuit coupling means is formed entirely from an impedance network interposed between said plurality of crystals and said amplifier input; and
said impedance network representing a lumped element approximation of a section of coaxial cable and having a preselected impedance the value of which determines the manner in which said plurality .of crystals resonate at said amplifier input.

12. A crystal controlled oscillator as set forth in claim 11 in which:
said crystals operate as a parallel resonant circuit at said amplifier input when the impedance value of said impedance network approximates a one-quarter wavelength section of coaxial cable at said frequency of oscillation.

13. A crystal controlled oscillator as set forth in claim 11 in which:
said crystals operate as a series resonant circuit at said amplifier input when the impedance value of said impedance network approximates a one-quarter wavelength section of coaxial cable at said frequency of oscillation.

14. A crystal controlled oscillator as set forth in claim 1 in which:
said amplifier, power splitter and first tuning circuit are secured to a heat sinking means;
said plurality of crystal resonators are secured to a vibration dampening means extending from said heat sinking means; and
said plurality of crystals are connected to said amplifier input and to said first tuning circuit by said circuit coupling means.

15. A crystal controlled oscillator as set forth in claim 1 which includes:
a second tuning circuit connected with said plurality of crystals, said second tuning circuit being operable to adjust said preselected frequency of oscillation by a preselected incremental amount.

16. A crystal controlled oscillator as set forth in claim 1 which includes:
an automatic leveling circuit connected between said power splitter first output and said amplifier ground reference terminal for maintaining said amplifier preselected value of gain at a substantially constant value.

17. A crystal controlled oscillator as set forth in claim 1 in which:
said amplifier, power splitter and first tuning circuit are each of modular-type construction and have an input impedance of substantially fifty ohms and an output impedance of substantially fifty ohms.

18. A crystal controlled oscillator comprising:
a transistor-type amplifier having a base terminal, a collector terminal and an emitter terminal;
said amplifier increasing the dB level of a signal passed from said base terminal to said collector terminal by a preselected value or gain to produce an amplified dB signal;
a feedback circuit connected between said collector terminal and said base terminal for returning a portion of said amplified dB signal to said base terminal;
a plurality of crystals connected which each other in a preselected electrical configuration;
coaxial coupling means for connecting said plurality of crystals to said amplifier emitter terminal; and
said plurality of crystals and said feedback circuit establishing a preselected frequency of oscillation of said portion of said amplified dB signal returned to said base terminal.

19. A crystal controlled oscillator as set forth in claim 18 in which:
at least a portion of said first coaxial coupling means is formed from a section of coaxial cable.

20. A crystal controlled oscillator as set forth in claim 18 in which:
said plurality of crystals includes at least four AT-cut crystals serially connected with each other.

21. A crystal controlled oscillator as set forth in claim 18 in which:
said amplifier and said feedback circuit are secured to a heat sinking means;
said plurality of crystals are secured to a vibration dampening means extending from said heat sinking means; and
said plurality of crystals are connected with said emitter terminal by said coaxial coupling means.

22. A crystal controlled oscillator comprising:
an amplifier secured to a heat sinking means;
said amplifier increasing the dB level of a signal passed therethrough by a preselected value of gain;
a plurality of crystals secured to a vibration dampening means;
said plurality of crystals being connected to each other in a preselected electrical configuration and isolated from said heat sinking means; and
a preselected wavelength section of coaxial cable for electrically connecting said plurality of crystals with said amplifier.

* * * * *